(12) United States Patent
Liu

(10) Patent No.: US 12,324,148 B2
(45) Date of Patent: Jun. 3, 2025

(54) METHOD FOR FORMING SEMICONDUCTOR STRUCTURE AND A SEMICONDUCTOR

(71) Applicant: ChangXin Memory Technologies, Inc., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/767,574

(22) PCT Filed: Aug. 16, 2021

(86) PCT No.: PCT/CN2021/112876
§ 371 (c)(1),
(2) Date: Apr. 8, 2022

(87) PCT Pub. No.: WO2022/134623
PCT Pub. Date: Jun. 30, 2022

(65) Prior Publication Data
US 2024/0268104 A1    Aug. 8, 2024

(30) Foreign Application Priority Data

Dec. 24, 2020 (CN) .......................... 202011552783.6

(51) Int. Cl.
*H10B 12/00* (2023.01)
*H01L 21/768* (2006.01)
*H01L 23/522* (2006.01)

(52) U.S. Cl.
CPC ......... *H10B 12/50* (2023.02); *H01L 21/7682* (2013.01); *H01L 21/76837* (2013.01); *H01L 23/5222* (2013.01)

(58) Field of Classification Search
CPC ................ H10B 12/50; H01L 21/7682; H01L 21/76837; H01L 23/5222
(Continued)

(56) References Cited

U.S. PATENT DOCUMENTS 5,744,865 A    4/1998  Jeng et al.
5,989,992 A    11/1999 Yabu
(Continued)

FOREIGN PATENT DOCUMENTS

CN    214428620 U    10/2021

OTHER PUBLICATIONS

EP 21908628.7 Extended European Search Report mailed Jul. 24, 2023.
(Continued)

*Primary Examiner* — Tong-Ho Kim
(74) *Attorney, Agent, or Firm* — Kilpatrick Townsend & Stockton LLP

(57) ABSTRACT

The embodiments of the present application provide a semiconductor structure manufacturing method for forming a semiconductor structure. The method includes: forming a plurality of discrete transistor structures (102) on a substrate (101); forming a dielectric layer (111) covering the transistor structure (102); forming a plurality of metal lines (103) on the top surface of the dielectric layer (111); forming an opening (105) in the gap between two of the plurality of metal lines (103); the insulation layer (106) fills the opening (105), the dielectric constant of the insulating layer (106) is smaller than the dielectric constant of the dielectric layer, and therefore the insulating layer (106) reduces the parasitic capacitance between the metal lines (103) as well as the parasitic capacitance between the metal lines (103) and the transistor structure (102); this method discloses how to form plurality of metal lines in the chip array area, meanwhile (Continued)

keeping the parasitic capacitance between the formed metal lines and other conductive structures small.

18 Claims, 7 Drawing Sheets

(58) Field of Classification Search
USPC .......................................................... 257/296
See application file for complete search history.

(56) References Cited

U.S. PATENT DOCUMENTS

| | | |
|---|---|---|
| 8,232,618 B2 | 7/2012 | Breyta et al. |
| 10,211,146 B2 | 2/2019 | He et al. |
| 2011/0309517 A1* | 12/2011 | Miki ................... H01L 21/7682 |
| | | 257/774 |
| 2014/0073128 A1 | 3/2014 | Jong |
| 2016/0372419 A1 | 12/2016 | Tsunemine et al. |
| 2020/0168458 A1* | 5/2020 | Liao .................. H01L 21/76816 |

OTHER PUBLICATIONS

State Intellectual Property Office of the People's Republic of China, Office Action and Search Report Issued in Application No. 202011552783.6, Jul. 31, 2024, 8 pages.

* cited by examiner

US 12,324,148 B2

METHOD FOR FORMING SEMICONDUCTOR STRUCTURE AND A SEMICONDUCTOR

CROSS REFERENCES TO RELATED APPLICATIONS

This application claims the benefit of priority to CN Patent Application CN 202011552783.6, filed on Dec. 24, 2020, entitled "A Method For Forming Semiconductor Structure And A Semiconductor Structure", the contents of which are incorporated herein by reference in its entirety.

TECHNICAL FIELD

This application relates to a method for forming a semiconductor structure and a semiconductor structure.

BACKGROUND

The array area layout of the traditional dynamic random access memory (DRAM) is limited by the word line spacing and the bit line spacing.

Advancement of process technology has shrank the sizes of semiconductor structures gradually, so word line spacing and bit line spacing have continuously decreased, resulting in difficult patterning of metal layer wires in the array area. In addition, due to feature size shrinking, parasitic capacitance increases between a metal layer and other conductive structures (for example, a transistor structure located between two arrays), which affects the electrical performance of the resultant semiconductor structure.

How to form a metal layer in the array area with reduced parasitic capacitance between the metal layer and other conductive structures is a problem to be solved urgently.

SUMMARY

An embodiment of the present application provides a method for forming a semiconductor structure, including: forming a plurality of discrete transistor structures on a substrate; forming a dielectric layer covering the transistor structures; and forming a plurality of metal lines on the top surface of the dielectric layer; forming an opening in the gap between two of the discrete the metal layers; filling the opening with an insulating layer, herein the dielectric constant of the insulating layer is smaller than the dielectric constant of the dielectric layer, thus the insulating layer reduces the parasitic capacitance between the a plurality of metal lines, and reduces the parasitic capacitance between the a plurality of metal lines with the transistor structure.

The embodiments of the present application also provide a semiconductor structure, comprising: a transistor structure located on the surface of the substrate; a dielectric layer covering the substrate and the transistor structure; and a plurality of metal lines, separately arranged on the top surface of the dielectric layer; openings formed in the dielectric layer, each in the gap between two a plurality of metal lines; and an insulating layer, filling the gap between the openings and the discrete metal layer. Herein the dielectric constant of the insulating layer is smaller than the dielectric constant of the dielectric layer, which reduces the parasitic capacitance between the a plurality of metal lines, and the parasitic capacitance between the metal layers and the transistor structures.

DETAILED DESCRIPTION OF THE PREFERRED EMBODIMENTS

With the advancement of technology, the sizes of semiconductor structures continuously shrink, word line spacing and bit line spacing have significantly decreased, resulting in the difficulty patterning the metal lines in the array area. Also due to the shrinking feature sizes, parasitic capacitance increases between a metal layer and other conductive structures, such as transistor structures located between two arrays, which affects the electrical performance of the formed semiconductor structures.

An embodiment of the present application provides a method for forming a semiconductor structure, including: forming a plurality of discrete transistor structures on a substrate; forming a dielectric layer covering the transistor structure; and forming a plurality of metal lines on the top surface of the dielectric layer; forming openings in the gaps between the a plurality of metal lines; filling the openings with an insulating layer, herein the dielectric constant of the insulating layer is smaller than the dielectric constant of the dielectric layer. The insulating layer reduces the parasitic capacitance between the a plurality of metal lines, and reduces the parasitic capacitance between the descrete metal layers and the transistor structures.

A person of ordinary skill in the art can understand that in each embodiment of the present invention, many technical details are proposed in order to enable the reader to better understand the present application. However, even without these technical details and various changes and modifications based on the following embodiments, the technical features claimed in this application can be realized.

Figure 1:
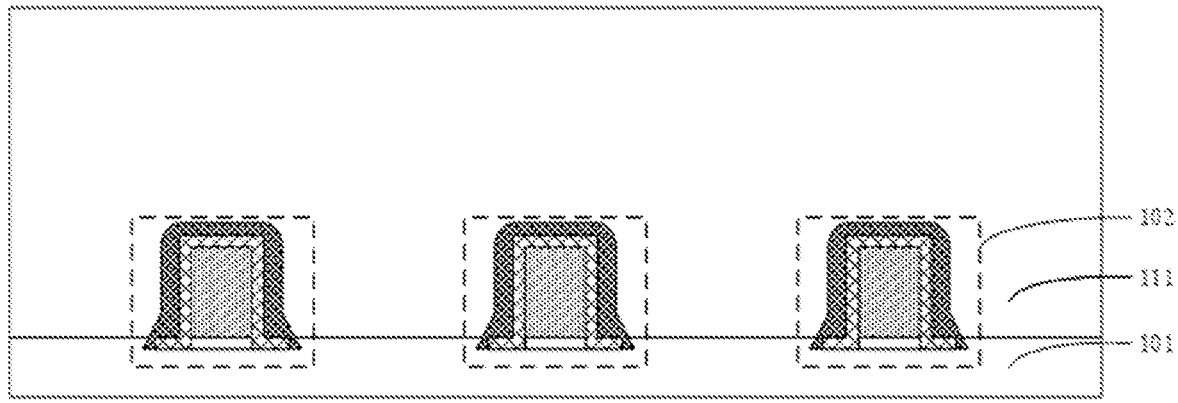
FIGS. 1-12 show cross-sectional structures following each step during a process forming a semiconductor structure according to an embodiment of the application.

FIGS. 1-12 show cross-sectional structures following each step of a process forming a semiconductor structure according to an embodiment of the application. The method for forming a semiconductor structure provided by this embodiment will be described in further detail below with reference to the accompanying drawings, as follows:

FIG. 1 shows a substrate 101, a plurality of discrete transistor structures 102 formed on the substrate 101, and a dielectric layer 111 formed covering the transistor structures 102.

The material of the substrate 101 may include sapphire, silicon, silicon carbide, gallium arsenide, aluminum nitride or zinc oxide, etc.; in this embodiment, the substrate 101 is made of silicon material, known to those skilled in the art. The silicon material in the substrate 101 facilitates the subsequent forming method, which does not constitute a limitation. In the actual application process, a suitable substrate material can be selected according to requirements.

The plurality of discrete transistor structures 102 is separately located on the substrate 101. It should be noted that the transistor structures 102 shown in the drawings are simplified structures and only drawn to show the position of the transistor structures 102. The transistor structures 102 in the figure do not constitute a reference to limit the present embodiment. In addition, the substrate 101 also includes other semiconductor structures such as shallow trench isolation structure, which is not involved as claimed limits in the application, so it will not be repeated here. Those skilled in the art can understand that the substrate 101 and standard semiconductor structures are shown in FIG. 1.

In this embodiment, the dielectric layer 111 is an interlayer dielectric (ILD), which is used to electrically isolate the subsequently formed metal layer from contacting the transistor structures 102 on the substrate 101. In an example, in the direction perpendicular to the surface of the substrate 101, the thickness of the dielectric layer 111 is configured to be in the range of 100 nm~150 nm, for examples, set at 110 nm, 120 nm, 130 nm or 140 nm; if the thickness of the dielectric layer 111 is less than 100 nm, there will be a risk of short circuit between the subsequently formed metal layer and the transistor structure 102 due to the thinner dielectric layer. If the thickness of the dielectric layer 111 is greater than 150 nm, the final semiconductor structure may be too thick, which could easily limit the usage of the semiconductor structures. The material of the dielectric layer 111 is an insulating material, such as silicon dioxide, silicon nitride, silicon oxynitride, or the like.

Specifically, the method for forming the dielectric layer 111 includes spin-on deposition (SOD), and the method of forming the dielectric layer 111 by SOD has good adhesion and gap filling ability, will enable the formed layer 111 completely cover the discrete transistor structure 102, thereby avoiding the risk of short circuit in the transistor structures 102.

Referring to FIGS. 2-7, a plurality of metal lines 103 are formed on the top surface of the dielectric layer 111, and openings 105 are formed in the gaps between the a plurality of metal lines 103. The formation of the a plurality of metal lines 103 and the openings 105 are described in the following paragraphs with reference to the drawings.

Figure 2:
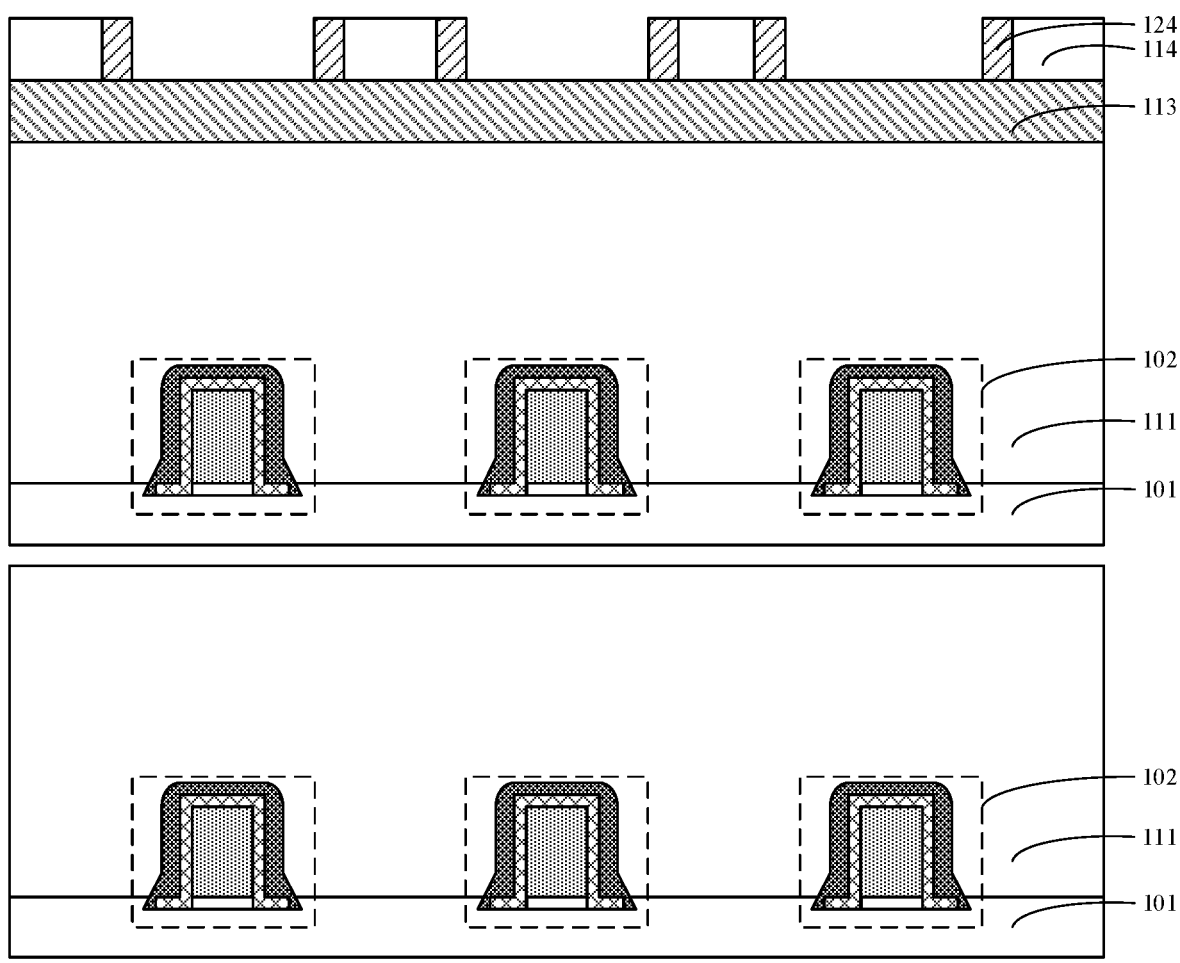

Referring to FIG. 2, a metal film 113 is disposed on the top surface of the dielectric layer 111 so the metal film covers the dielectric layer 111, a patterned first mask layer 114 is formed on the top surface of the metal film 113, and a second mask layer 124 is formed on the sidewalls of the patterned first mask layer 114.

Specifically, the initial metal film (not shown) is formed by an atomic layer deposition method or a chemical vapor deposition method. In this embodiment, the initial metal film is formed by atomic layer deposition. The initial metal film formed by atomic layer deposition has good coverage. In other embodiments, for example, a chemical vapor deposition method at 500° C. or 600° C. may be used to form the metal film.

After the initial metal film is formed, the top of the initial metal film is polished by chemical mechanical polishing to form a metal film 113 with a relatively flat top surface. The chemical mechanical polishing method has a higher removal rate so is conducive to shorten the process cycle.

In this embodiment, the metal film 113 may include a conductive material or composed of multiple conductive materials, such as doped polysilicon, titanium, titanium nitride, tungsten and tungsten composites, etc. The metal film 113 helps to form a metal layer subsequently, which then interconnects the capacitor structure in the DRAM array area.

After the metal film 113 is formed, a first mask (not shown) is formed on the top surface of the metal film 113, and then a patterned photoresist layer is formed on the top surface of the first mask, based on the patterned photoresist layer, a patterned first mask layer 114 is formed.

After the first mask layer 114 is formed, a second mask layer 124 is formed on the sidewalls of the first mask layer 114.

Specifically, the second mask layer 124 is formed by the atomic layer deposition method. The second mask layer 124 formed by the atomic layer deposition has good density, and the thickness of the second mask layer 124 is controllable.

Parallel to the surface of the substrate 101 and perpendicular to the first mask layer 114, the second mask layer 124 is formed which has a width ranging from 10 nm to 50 nm, for example as 20 nm, 30 nm or 40 nm. If the width of the second mask layer 124 is less than 10 nm, causing the width of the subsequently formed opening to be less than 10 nm, so the effect of reducing parasitic capacitance is poor; if the width of the second mask layer 124 is greater than 50 nm, the metal interconnection can take up more of the chip area so will not be conducive to the chip's miniaturization.

In this embodiment, the material of the second mask layer 124 and the first mask layer 114 are different, so there is an etching selection ratio for subsequent etching of the first mask layer 114 and the second mask layer 124.

Figure 3:
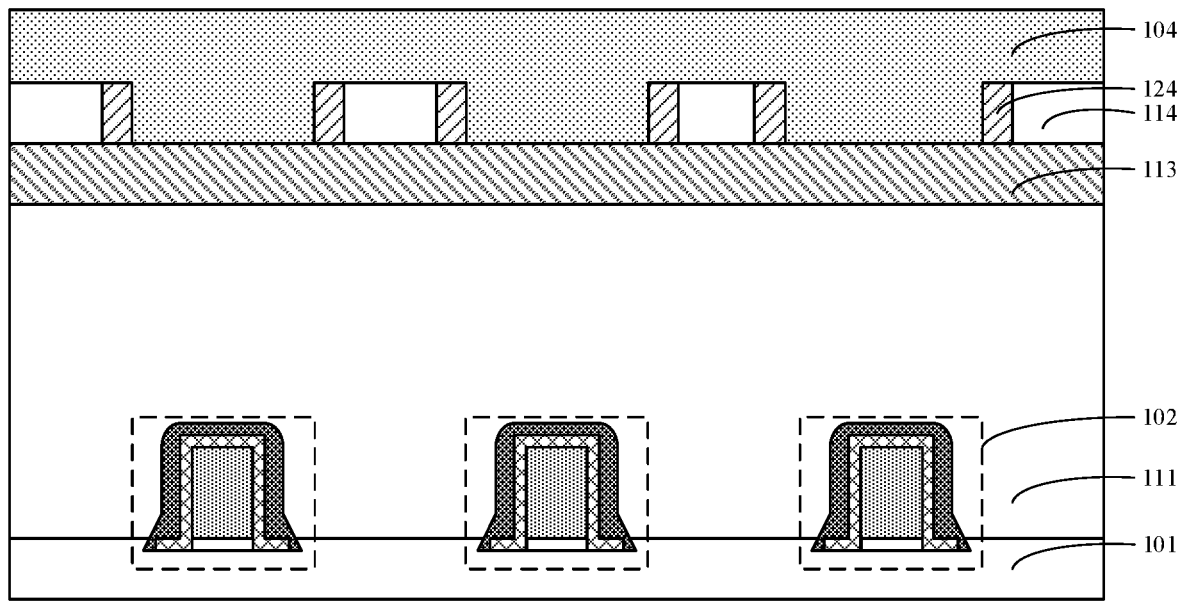
Figure 4:
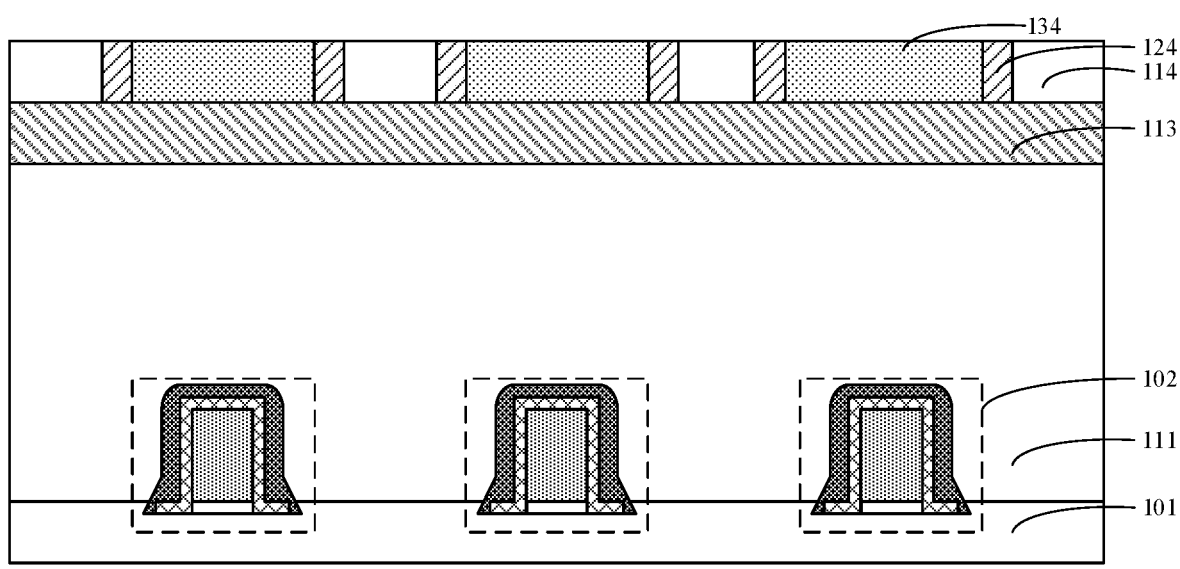

Referring to FIGS. 3 and 4, a third mask layer 134 is formed, this third mask layer 134 fills the gaps between the adjacent second mask layers 124.

Specifically, referring to FIG. 3, a third mask 104 covers the first mask layer 114 and the second mask layer 124 and it fills the gaps between the second mask layers 124.

Specifically, the third mask 104 is first formed by chemical vapor deposition, such formed third mask 104 has a higher deposition rate, which is beneficial to shorten the process cycle.

In this embodiment, the materials of the third mask 104 and the second mask layer 124 are different, so there is an etching selection ratio for subsequent selective etching of the third mask 104 and the second mask layer 124.

In FIG. 4, the third mask film 104 on the top surfaces of the first mask layer 114 and the second mask layer 124 is removed to form a third mask layer 134.

After the third mask 104 is formed, the third mask 104 on the top surfaces of the first mask layer 114 and the second mask layer 124 is removed by chemical mechanical polishing or etching. In this embodiment the third mask 104 on the top surfaces of the first mask layer 114 and the second mask layer 124 is removed by chemical mechanical polishing. Compared with etching, chemical mechanical polishing has a higher removal rate, which is beneficial to shorten the process cycle.

Figure 5:
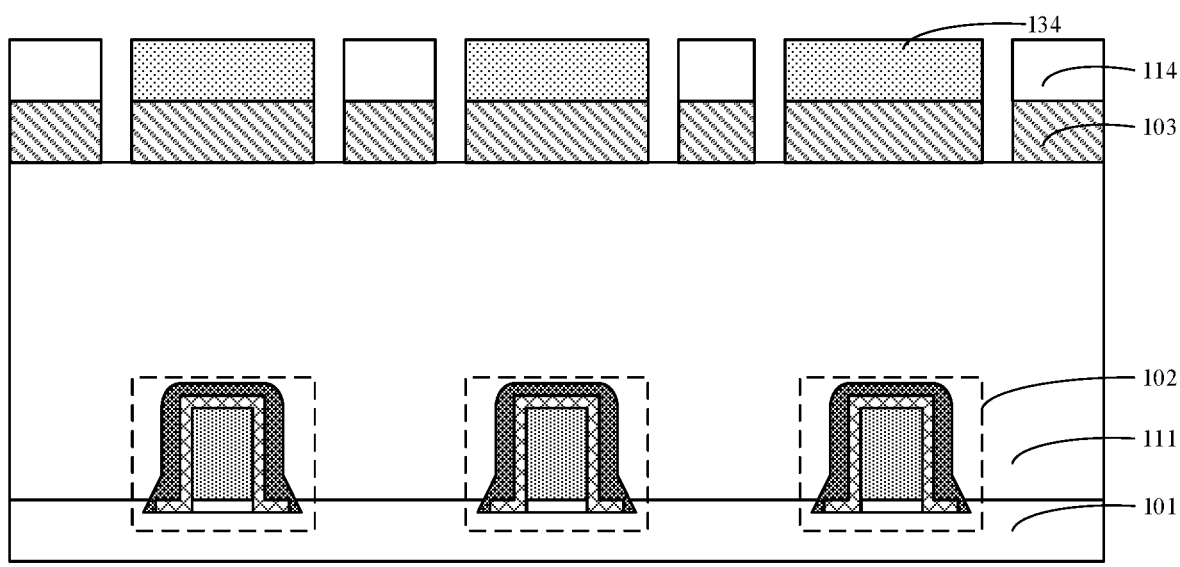

Referring to FIG. 5, the second mask layer 124 (refer to FIG. 4) is removed until the metal film 113 (refer to FIG. 4) is exposed. Based on the first mask layer 114 and the third mask layer 134, the exposed metal film 113 constitutes multiple a plurality of metal lines 103.

Since the second mask layer 124 and the first mask layer 114 have an etching selection ratio, and the second mask layer 124 and the third mask layer 134 have an etching selection ratio, the etching speed of the second mask layer 124 is higher than the etching speeds of the first mask layer 114 and the third mask layer 134, and the second mask layer 124 is selectively removed until the metal film 113 is exposed.

After the second mask layer 124 is removed, based on the first mask layer 114 and the third mask layer 134, the exposed metal film 113 is etched and removed by dry etching. The higher vertical etching rate and the lower horizontal etching rate of dry etch makes the edge morphology of the formed metal layer 103 very good.

Figure 6:
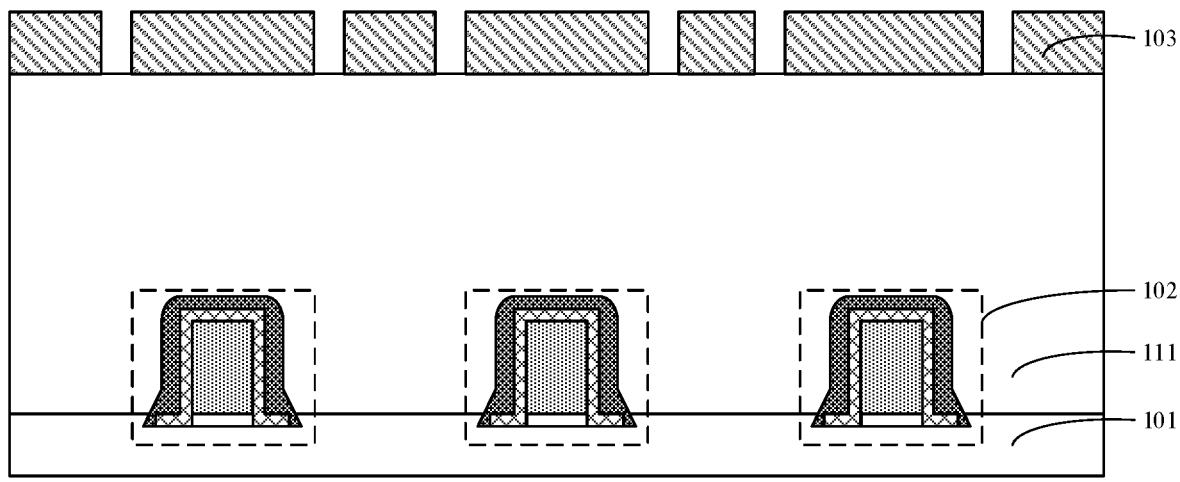

Referring to FIG. 6, the first mask layer 114 and the third mask layer 134 are removed.

After the a plurality of metal lines 103 are formed, the first mask layer 114 and the third mask layer 134 are removed. Specifically, the first mask layer 114 and the second mask layer 124 are removed by chemical mechanical polishing or etching. In this embodiment, the first mask layer 114 and the second mask layer 124 are removed by chemical mechanical polishing, because the chemical mechanical polishing has a higher removal rate than the etching method, which is conducive to shorten the process cycle.

Figure 7:
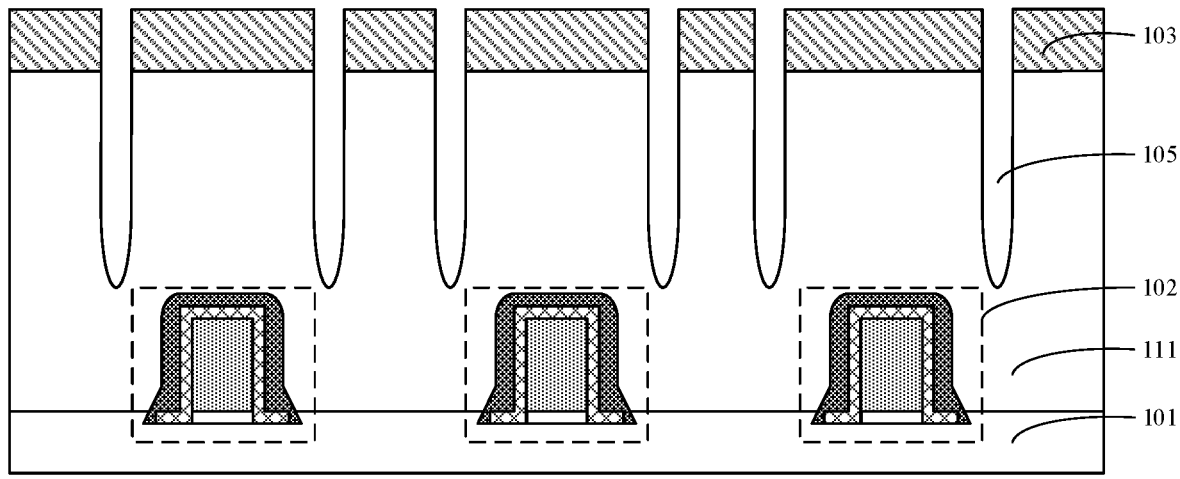

Referring to FIG. 7, guided by the gap between the a plurality of metal lines 103, an opening 105 is formed in the gap between two adjacent metal layers 103.

In an example, the insulating layer filling each of the openings 105 is a single-layer structure. The single-layered insulating layer forming will be described in detail below with reference to the accompanying drawings.

Figure 8:
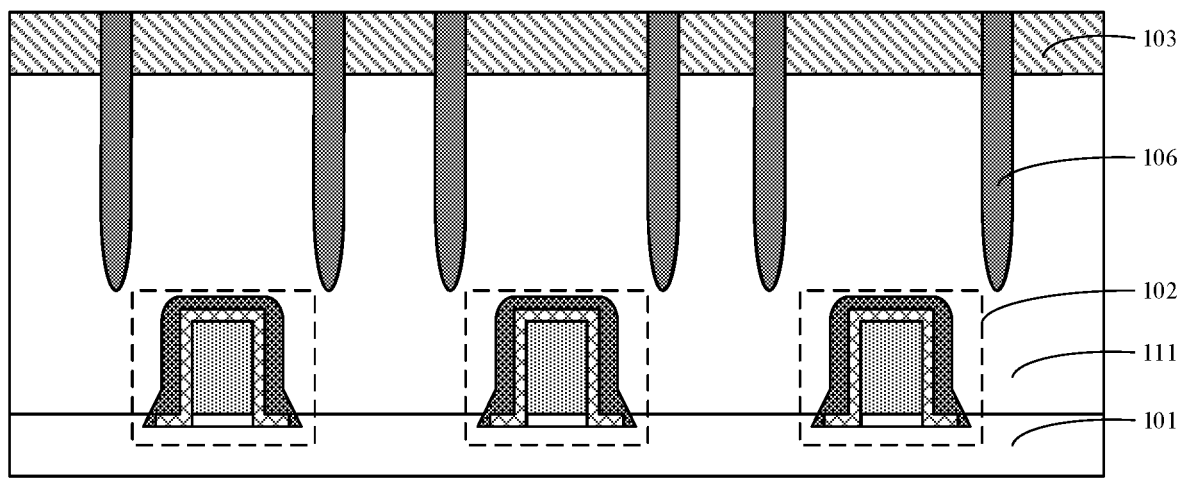

Referring to FIG. 8, the opening 105 is filled with an insulating layer 106 (refer to FIG. 8). The dielectric constant of the insulating layer 106 is configured to be smaller than the dielectric constant of the dielectric layer 111. The insulating layer 106 reduces the parasitic capacitance between the a plurality of metal lines 103, and the parasitic capacitance between any of the metal layers 103 and the transistor structure 102.

Specifically, the insulating layer 106 filling the opening 105 is formed by applying atomic layer deposition, and the insulating layer 106 formed by atomic layer deposition is more compact. In this embodiment, the material of the insulating layer 106 includes silicon oxide doped with low levels of boron or phosphorus; in other embodiments, the material of the insulating layer can be specifically set according to the material of the dielectric layer.

By forming the insulating layer 106 to replace part of the dielectric layer 111, the dielectric constant of the semiconductor structure between the metal layers 103 and the transistor structures 102 is reduced, thereby reducing the parasitic capacitance between the metal layers 103 and the transistor structures 102. And by reducing the dielectric constant of the semiconductor structure between the adjacent a plurality of metal lines 103, the parasitic capacitance between one metal layer 103 and another metal layer 103 is thereby reduced; in addition, providing an insulating layer 106 between two adjacent metal layers 103 also prevents any electrical crosstalk between two metal layers 103 spaced apart with a small interval.

In another embodiment, the insulating layer filling the opening 105 has a multilayer structure. In this embodiment, a two-layer structure is chosen for example. The insulating layer of the formed multilayer structure will be described in detail below with reference to the accompanying drawings. In other embodiments, the insulating layer can also have a three-layer or above three-layer structure. Those skilled in the art understand that the method for forming a two-layer insulating structure disclosed in this embodiment can be applied to a more than two-layer structure. The method of forming the insulating layer should fall within the protection scope of this application.

Figure 9:
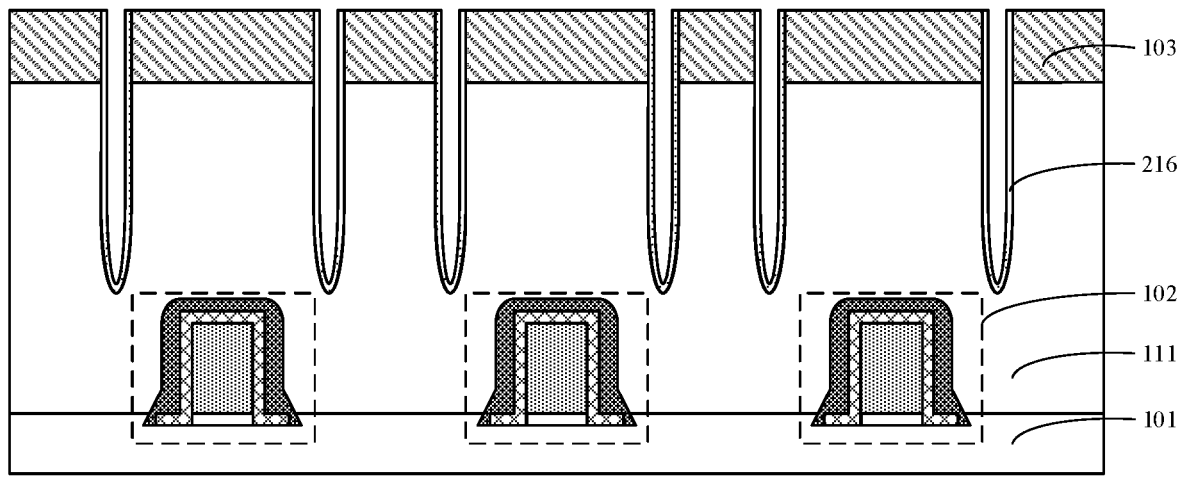

Referring to FIG. 9, a first insulating film 216 covering the sidewalls of the opening 105 (refer to FIG. 7) and the sidewalls of the metal layers 103 is formed.

Specifically, the first insulating film 216 is formed by the atomic layer deposition method, and such formed first insulating film 216 has a good density, and the thickness of the first insulating film 216 is controllable.

In this embodiment, the thickness of the formed first insulating film 216 is in a range of 2 nm-10 nm, for example, 4 nm, 6 nm, or 8 nm.

Figure 10:
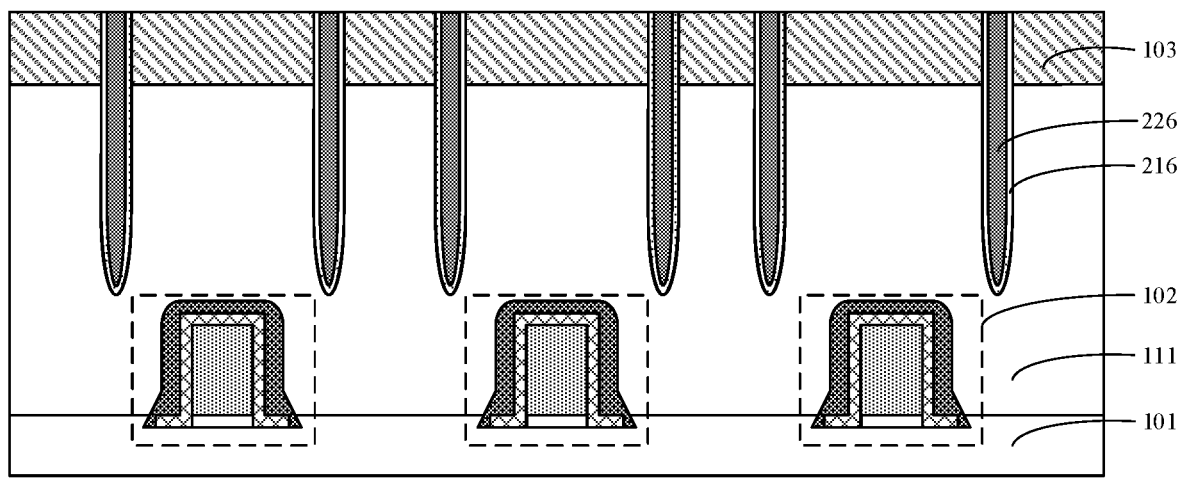

In FIG. 10, a second insulating film 226 is formed on the sidewalls of the first insulating film 216. The materials of the first insulating film 216 and the second insulating film 226 are different, and the first insulating film 216 and the second insulating film 226 together form an insulating layer.

Specifically, the second insulating film 226 is formed by atomic layer deposition, and such formed second insulating film 226 has a good coverage. In other embodiments, for example, temperature in a range from 500° C. or 600° C. may be applied in the process of forming the second insulating film on the metal layers by the method of chemical vapor deposition.

Compared with the insulating layer of a single layer structure, the insulating layer of the multilayer structure is formed by insulating films formed of different materials, which can further reduce the dielectric constant of the formed insulating layer. It should be noted that the first insulating film 216 and the second insulating film 226 can include the same material or different materials. Even if the first insulating film 216 and the second insulating film 226 share the same material, there is an interface layer between the first insulating film 216 and the second insulating films 226, which can still reduce the effective dielectric constant of the resultant insulating layer.

Figure 11:
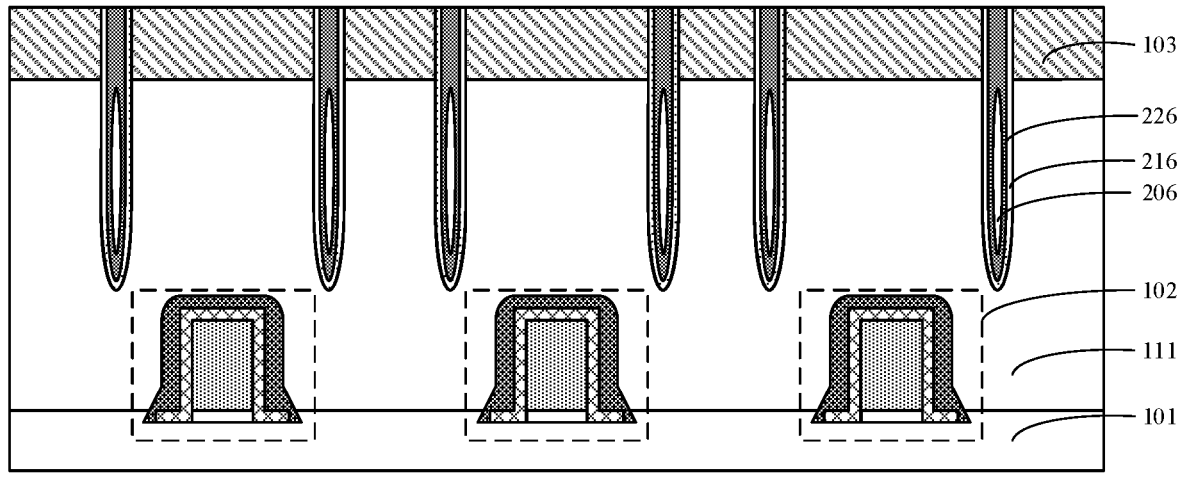

Further, referring to FIG. 11, the second insulating film 226 may also enclose an air gap 206, and the air gap 206 further reduces the dielectric constant of the insulating layer. Specifically, this embodiment provides two methods for forming the air gap 206, which are described specifically as follows:

Method 1: A second insulating film 226 is formed on the sidewalls of the first insulating film 216 by means of the atomic layer deposition, and the gap between two adjacent metal layers 103 is sealed to form an air gap 206.

Method 2: Applying a sealing process to form a second insulating film 226 on the top parts of the sidewalls of the first insulating film 216, and at the same time enclosing an air gap 206.

In the direction perpendicular to the surface of the substrate 101, the length of the air gap 206 is at least 10 nm. In an example, the length of the air gap 206 is in a range of 10 nm~100 nm, for example, it can be set at 30 nm, 50 nm, 70 nm or 90 nm. If the length of the air gap 206 is less than 10 nm, the effect of reducing the dielectric constant through the air gap 206 will be poor, if the length of the air gap 206 is greater than 100 nm, there may be electrical breakdown due to the large air gap, resulting in a short circuit phenomenon. It should be noted that the length of the air gap 206 is in the range from 10 nm to 100 nm, assuming the thickness of the dielectric layer 111 is in a range from 100 nm to 150 nm. In a specific application process, the length of the air gap 206 can be set according to the thickness of the dielectric layer 111.

By forming the air gap 206, the dielectric constant of the semiconductor structure between the metal layers 103 and the transistor structures 102 is further reduced, thereby the parasitic capacitance between the metal layers 103 and the transistor structures 102 is reduced.

Figure 12:
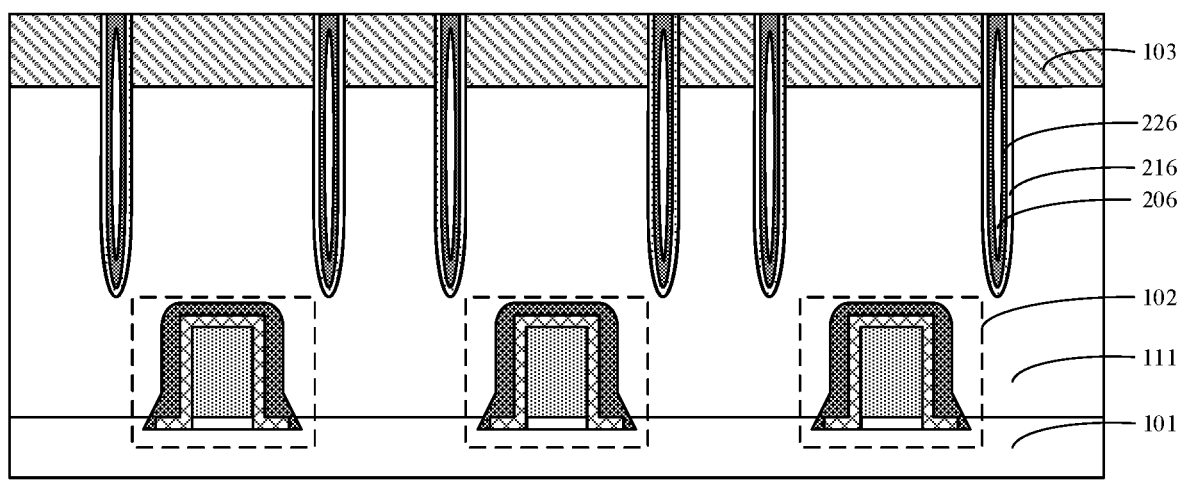

Further, referring to FIG. 12, the enclosed air gap 206 is also located in the gap between two adjacent metal layers 103. The air gap 206 is also located between the metal layers 103, which can further reduce the dielectric constant of the resultant semiconductor structure between two adjacent the metal layers 103, thereby reducing the parasitic capacitance between those two metal layers 103.

Based on the gap between two adjacent metal layers, an opening between the metal layers is formed in the dielectric layer, and the opening is filled with an insulating layer with a smaller dielectric constant than that of the dielectric layer, which reduces the dielectric constant of the semiconductor structures between the metal layers and the transistor structures, thereby reducing the parasitic capacitance between the metal layers and the transistor structures, as well as the parasitic capacitance among metal layers.

Dividing the process into various steps above is just for clarity of the description. When implemented, some can be combined into one step or some step can be split into multiple steps, as long as they include the same reasonable relationship, they are all within the scope of protection of this patent. Any extra steps by adding insignificant modifications to the process or introducing insignificant designs, without changing the critical flow of the process, are all within the scope of protection of the patent.

Another embodiment of the present application relates to a semiconductor structure, including: a transistor structure, located on the surface of the substrate; a dielectric layer, covering the substrate and the transistor structure; a metal layer, patterned into a plurality of metal lines, on the top surface of the dielectric layer; openings, from the gap between two adjacent metal layers are formed in the dielectric layer; herein the insulating layer fills the openings in the gaps between metal layers. The dielectric constant of the insulating layer is smaller than that of the dielectric layer, thereby reducing the parasitic capacitance between the metal layers as well as the parasitic capacitance between the metal layers and the transistor structures.

FIGS. 8, 10 to 12 are schematic cross-sectional views of the semiconductor structure provided by this embodiment. The semiconductor structure provided by this embodiment will be described in detail below in conjunction with the accompanying drawings, and the parts that are the same as or corresponding to the above embodiment will be described in detail below. The detailed description will not be given below.

Referring to FIG. 8, the semiconductor structure includes a substrate 101. The material of the substrate 101 may include sapphire, silicon, silicon carbide, gallium arsenide, aluminum nitride, or zinc oxide; in this embodiment, the substrate 101 has silicon.

The transistor structures 102 are located on the surface of the substrate 101. The transistor structures 102 are separately located on the substrate 101. The positions of the transistor structures 102 do not constitute a limitation to this embodiment.

It should be noted that the substrate 101 may also include other semiconductor structures such as shallow trench isolation structures. Since the critical structures of the application are not referring to those, they will not be repeated here. Those skilled in the art can understand the substrate 101 can includes other structures that enable the normal operation of semiconductor structures.

The dielectric layer 111 covers the substrate 101 and the transistor structures 102. In this embodiment, the dielectric layer 111 is an inter-layer dielectric (ILD) for electrically isolating the subsequently formed metal layers from The transistor structures 102 on the substrate 101. In an example, in a direction perpendicular to the surface of the substrate 101, the thickness of the dielectric layer 111 is in a range from 100 nm to 150 nm, for example, 110 nm, 120 nm, 130 nm, or 140 nm.

The a plurality of metal lines 103 are disposed by patterning on the top surface of the dielectric layer 111. In this embodiment, the metal layers 103 may comprise a conductive material or composed of multiple conductive materials, such as doped polysilicon, titanium, and titanium nitride, tungsten, tungsten composites, etc., and the metal layers 103 interconnect the capacitor structure in the DRAM array area. In a plane parallel to the surface of the substrate 101 and in a direction perpendicular to the first mask layer 114, the width of the gap between two metal layers is in the range of 10 nm-50 nm, such as set at 20 nm, 30 nm, or 40 nm.

The opening 105 (refer to FIG. 7) is provided in the dielectric layer 111 located in the gap between two adjacent metal layers 103.

In this embodiment, the insulating layer 106 is a single-layer structure. The insulating layer 106 fills the gap between the opening 105 and the metal layer 103 with the insulator 106 of smaller dielectric constant than that of dielectric layer 111, to reduce the parasitic capacitance between the small metal layers 103 and the parasitic capacitance between the metal layers 103 and the transistor structures 102. In this embodiment, the material of the insulating layer 106 includes silicon oxide doped with boron or phosphorus; in other embodiments, the material of the insulating layer may be specifically set according to the material of the dielectric layer.

In other embodiments, the insulating layer has a multilayer structure. Taking a two-layer structure as an example, the insulating layer of the multilayer structure will be described in detail below with reference to the accompanying drawings. It should be noted that the insulating layer may also be a three-layer structure, or a structure with more than three layers. Those skilled in the art understand that the two-layer insulating structure disclosed in this embodiment can be applied to a multilayer structure. Unless a structure has a very different insulating layer undisclosed in this application, it should fall within the scope of protection of the present application.

In an example, referring to FIG. 10, the insulating layer includes: a first insulating film 216 located on the sidewalls of the opening 105 and the a plurality of metal lines 103; a second insulating film 226 located on the sidewalls of the first insulating film 216 and filling the opening in the gap between the opening 105 and the metal layer 103, the materials of the first insulating film 216 and the second insulating film 226 are different. Compared with an insulating layer of a single layer structure, insulating films of different materials constitute an insulating layer of a multilayer structure, which can further reduce the dielectric constant of the resultant insulating layer. It should be noted that the first insulating film 216 and the second insulating film 226 can use the same material or different materials, even if the first insulating film 216 and the second insulating film 226 have the same material, there is an interface layer between the first insulating film 216 and the second insulating films 226, which can still reduce the dielectric constant of the resultant insulating layer 106.

Specifically, the thickness of the formed first insulating film 216 ranges from 2 nm to 10 nm, for example, can be set at 4 nm, 6 nm, or 8 nm.

Based on the semiconductor structure of FIG. 10, and further, referring to FIG. 11, the insulating layer further includes an air gap 206 surrounded by the second insulating film 226 for further reducing the dielectric constant of the insulating layer. In the direction perpendicular to the surface of the substrate 101, the length of the air gap 206 is at least 10 nm. In an example, the length of the air gap 206 is in the range of 10 nm-100 nm, for example, can be set at 30 nm, 50 nm, 70 nm, or 90 nm. It should be noted that the length of the air gap 206 is 10 nm to 100 nm based on the thickness of the dielectric layer 111 being in the range from 100 nm to 150 nm. In a specific application process, the length of the air gap 206 can be specifically set according to the thickness of the dielectric layer 111.

Further, referring to FIG. 12, the air gaps 206 are also located in the gaps between two adjacent metal layers 103, as well as located between the metal layers 103, which can further reduce the dielectric constant of the semiconductor structure between the metal layer 103 and the metal layer 103. Therefore, the parasitic capacitance among the metal layer 103 and the metal layer 103 is all reduced.

In another example, the insulating layer includes a first insulating film located on the side walls of the opening and the metal layers; and a second insulating film located on the top parts of the side walls of the first insulating film for sealing the gap between two metal layers After sealing, the first insulating film and the second insulating film jointly enclose an air gap. The materials of the first insulating film and the second insulating film may be different; but also can be the same. It is applicable to the above structure. The air gap is directly formed by the sealed second insulating film, which reduces the dielectric constant of the semiconductor structure between the metal layers and the transistor structures, thereby reducing the parasitic capacitance between the metal layers and the transistor structures.

The dielectric constant of the insulating layer is smaller than the dielectric constant of the dielectric layer, and the insulating layer is located in the gap between two metal layers to reduce the dielectric constant of the semiconductor structures between the metal layers and the transistor structures, as well as to reduce the metal layer The dielectric constant of the semiconductor structure between the metal layer and the metal layer, thereby reducing the parasitic capacitance between the metal layer and the transistor structure, and reducing the parasitic capacitance between the metal layer and the metal layer.

Figure 13:
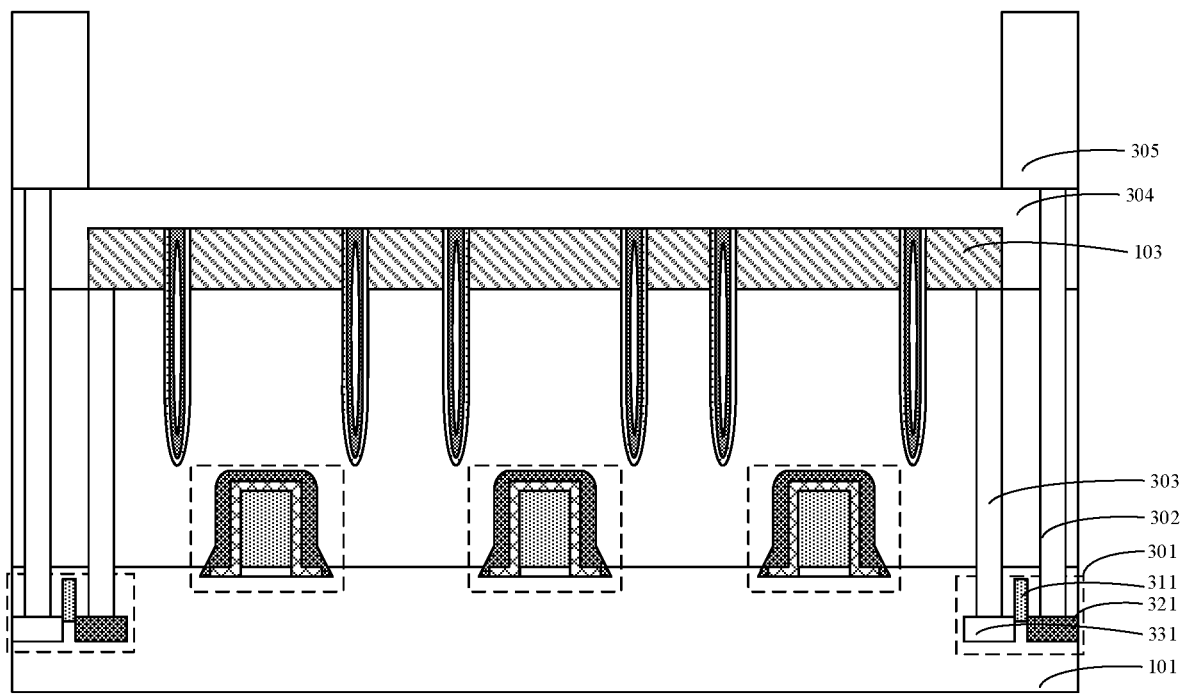
FIG. 13 is shows a cross-sectional structure of a semiconductor structure in one application according to another embodiment of this application.

FIG. 13 shows a cross-sectional structure of a semiconductor structure in one application according to another embodiment of this application. This embodiment is described based on the semiconductor structures provided in FIG. 12 as an example. It should be noted that the semiconductor structure provided in FIG. 12 can be replaced with the structures in FIG. 8 and FIG. 10 or the semiconductor structure provided in FIG. 11. The application of the semiconductor structure provided in this embodiment will be described in detail below with reference to the accompanying drawings.

A buried transistor structure 301 is provided in the substrate 101. The buried transistor structure 301 includes a buried gate 311, a buried source 321, and a buried drain 331, wherein the buried source The pole 321 electrically connects to the capacitor structure, and the buried drain 331 electrically connects to the metal layer 103.

Specifically, the semiconductor structure also has an intermediate layer 304 covering the metal layer 103. The intermediate layer 304 is the semiconductor structure between the metal layer 103 and the capacitor structure 305. This embodiment has the intermediate layer 304 characterized as its position in the semiconductor structure.

The semiconductor structure also has a first conductive layer 303 penetrating through the dielectric layer 111 and part of the substrate 101. The first conductive layer 303 is used to electrically connect the metal layer 103 and the buried drain 331 to realize the buried drain. The pole 331 is electrically connected to the metal layer 103.

The second conductive layer 304 penetrates the dielectric layer 111, the intermediate layer 304, and part of the substrate 101 in the semiconductor structure. The second conductive layer 304 electrically connects the capacitor structure 305 and the buried source 321 is electrically connected to the capacitor structure.

It should be noted that the capacitor structure 305 in this embodiment is characterized with the position of the capacitor structure 305, which does not limit the specific structure of the capacitor structure. In specific applications, the capacitor structure 305 can be a cylindrical capacitor or a double-sided capacitor.

Since the above-mentioned embodiments relate to this embodiment, this embodiment can be implemented in cooperation with the above-mentioned embodiment. The related technical details mentioned in the foregoing embodiment are still valid in this embodiment, and the technical functions that can be achieved in the foregoing embodiments can also be achieved in this embodiment. In order to reduce repetition, detailed descriptions that have been disclosed are not repeated here. Correspondingly, the relevant technical details mentioned in this embodiment can also be applied to the above-mentioned embodiment.

A person of ordinary skill in the art can understand that the above-mentioned embodiments are specific embodiments for realizing the present invention, and in other practical applications, various modifications can be made to them in form and details without departing from the spirit and scope of the present application.

The invention claimed is:
1. A method for forming a semiconductor structure, including:
   forming a plurality of discrete transistor structures on a substrate;
   forming a dielectric layer covering the plurality of discrete transistor structures;
   forming a plurality of metal lines on a top surface of the dielectric layer;
   forming an opening in a gap between two of plurality of metal lines; and
   filling the opening with an insulating layer;
   wherein a dielectric constant of the insulating layer is smaller than a dielectric constant of the dielectric layer, and wherein the insulating layer reduced a parasitic capacitance among the plurality of metal lines and a parasitic capacitance between the plurality of metal lines and the plurality of discrete transistor structures; and
   wherein a material of the insulating layer comprises silicon oxide doped with boron or phosphorus.

2. The method for forming the semiconductor structure according to claim 1, wherein forming the plurality of metal lines on the top surface of the dielectric layer comprises the following steps:
   forming a metal film covering the top surface of the dielectric layer;
   forming a first mask layer on a top surface of the metal film, wherein the first mask layer is patterned into lines;
   forming second mask layers on sidewalls of the first mask layer;
   forming a third mask layer that fills gap between the second mask layers;
   removing the second mask layers until the metal film is exposed; and removing the exposed metal film to form a discrete metal layer, based on the first mask layer and the third mask layer.

3. The method for forming the semiconductor structure according to claim 2, wherein forming the third mask layer that fills the gap between the second mask layers comprises the following steps:
forming a third mask that fills the gap between the second mask layers and covers the first mask layer and the second mask layers; and
forming the third mask layer on a top surface of the first mask layer; and
forming the third mask layer by removing the third mask on a top surface of the first mask layer and the second mask layers.

4. The method for forming the semiconductor structure according to claim 2, wherein the second mask layers are formed in a plane parallel to a surface of the substrate and in a direction perpendicular to the first mask layer, and have a width in a range of 10 nm-50 nm.

5. The method for forming the semiconductor structure according to claim 1, wherein filling the opening with an insulating layer comprises the following steps:
forming a first insulating film covering sidewalls of the opening and sidewalls of the plurality of metal lines; and
forming a second insulating film on sidewalls of the first insulating film;
wherein the first insulating film and the second insulating film are made of different materials, and wherein the first insulating film and the second insulating film together constitute the insulating layer.

6. The method for forming the semiconductor structure according to claim 5, wherein a thickness of the first insulating film is in a range from 2 nm to 10 nm.

7. The method for forming the semiconductor structure according to claim 5, wherein an air gap is surrounded by the second insulating film for reducing a dielectric constant of the insulating layer.

8. The method for forming a semiconductor structure according to claim 7, wherein the air gap is located in a gap between two of the plurality of metal lines.

9. The method for forming the semiconductor structure according to claim 8, wherein a length of the air gap is at least 10 nm in a direction perpendicular to the surface of the substrate.

10. The method for forming the semiconductor structure according to claim 7, wherein the second insulating film is formed on the sidewalls of the first insulating film by atomic layer deposition, and sealing is performed to enclose the air gap between two of the plurality of metal lines.

11. The method for forming the semiconductor structure according to claim 7, wherein the second insulating film is formed on a top part of the sidewalls of the first insulating film by a sealing process, and wherein the second insulating film encloses the air gap simultaneously.

12. A semiconductor structure comprising:
a transistor structure configured on a surface of a substrate;
a dielectric layer covering the surface of the substrate and the transistor structure;
a plurality of metal lines arranged on a top surface of the dielectric layer;
an opening disposed in the dielectric layer between two of the plurality of metal lines; and
an insulating layer filling a gap between the opening and the plurality of metal lines, wherein a dielectric constant of the insulating layer is smaller than a dielectric constant of the dielectric layer, and wherein a smaller dielectric constant reduces a parasitic capacitance between two of the plurality of metal lines, as well as a parasitic capacitance between the plurality of metal lines and the transistor structure; and
wherein a material of the insulating layer comprises silicon oxide doped with boron or phosphorus.

13. The semiconductor structure according to claim 12, wherein a width of a gap between the plurality of metal lines is 10 nm-50 nm.

14. The semiconductor structure of claim 12, wherein the insulating layer comprises:
a first insulating film disposed on side walls of the opening and the plurality of metal lines;
a second insulating film disposed on the sidewall of the first insulating film and filling the gap between the opening and the plurality of metal line; and
wherein the first insulating film and the second insulating film are made of different materials.

15. The semiconductor structure according to claim 14, wherein a thickness of the first insulating film is in a range from 2 nm to 10 nm.

16. The semiconductor structure according to claim 14, wherein the insulating layer further comprises: an air gap surrounded by the second insulating film for reducing the dielectric constant of the insulating layer.

17. The semiconductor structure of claim 16, wherein the air gap is also located in the gap between the plurality of metal lines.

18. The semiconductor structure of claim 12, wherein the insulating layer comprises:
a first insulating film disposed on side walls of the opening and the plurality of metal lines; and
a second insulating film disposed on a top part of side walls of the first insulating film, wherein the second insulating film seals a gap between two of the plurality of metal lines;
wherein the first insulating film and the second insulating film are made of different materials.

* * * * *